United States Patent
Nishide et al.

(10) Patent No.: US 11,251,353 B2
(45) Date of Patent: Feb. 15, 2022

(54) THERMOELECTRIC MATERIAL, THERMOELECTRIC MODULE, AND PRODUCING METHOD OF THERMOELECTRIC MATERIAL

(71) Applicant: HITACHI, LTD., Tokyo (JP)

(72) Inventors: Akinori Nishide, Tokyo (JP); Jyun Hayakawa, Tokyo (JP); Ken Kurosaki, Suita (JP); Sora-at Tanusilp, Suita (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/957,952

(22) Filed: Apr. 20, 2018

(65) Prior Publication Data

US 2018/0331269 A1      Nov. 15, 2018

(30) Foreign Application Priority Data

May 15, 2017   (JP) .............................. JP2017-096187

(51) Int. Cl.
| | |
|---|---|
| *H01L 35/22* | (2006.01) |
| *H01L 35/28* | (2006.01) |
| *H01L 35/34* | (2006.01) |
| *C04B 35/626* | (2006.01) |
| *C01B 33/06* | (2006.01) |
| *C04B 35/645* | (2006.01) |
| *C04B 35/58* | (2006.01) |
| *C22C 29/18* | (2006.01) |

(52) U.S. Cl.
CPC .............. *H01L 35/22* (2013.01); *C01B 33/06* (2013.01); *C04B 35/58085* (2013.01); *C04B 35/62665* (2013.01); *C04B 35/645* (2013.01); *C22C 29/18* (2013.01); *H01L 35/28* (2013.01); *H01L 35/34* (2013.01); *C04B 2235/40* (2013.01); *C04B 2235/42* (2013.01); *C04B 2235/428* (2013.01); *C04B 2235/6567* (2013.01); *C04B 2235/666* (2013.01)

(58) Field of Classification Search
None
See application file for complete search history.

(56) References Cited

U.S. PATENT DOCUMENTS

| | | | |
|---|---|---|---|
| 2011/0195185 A1* | 8/2011 | Mingo Bisquert | ..... C23C 16/30 427/248.1 |
| 2013/0186449 A1 | 7/2013 | Venkatasubramanian et al. | |
| 2015/0380624 A1 | 12/2015 | Tamaki et al. | |

FOREIGN PATENT DOCUMENTS

| | | |
|---|---|---|
| EP | 3 367 449 A1 | 8/2018 |
| JP | 2011-527517 A | 10/2011 |

(Continued)

OTHER PUBLICATIONS

Oganisian et al. (Thermoelectric Power of MgB2 Single Crystals Doped With Holes and Electrons.*

(Continued)

*Primary Examiner* — Niki Bakhtiari
(74) *Attorney, Agent, or Firm* — Miles & Stockbridge, P.C.

(57) ABSTRACT

There is provided a thermoelectric material including a compound which is formed of an element R belonging to alkaline earth metal and lanthanoid, and an element X belonging to any of Group 13 elements, Group 14 elements, and Group 15 elements. The composition ratio of the element R and the element X is selected to obtain the compound having an $AlB_2$ type structure.

4 Claims, 8 Drawing Sheets

(56) References Cited

FOREIGN PATENT DOCUMENTS

| JP | 2012-069663 A | 4/2012 |
|---|---|---|
| JP | 2012-174849 A | 9/2012 |
| JP | 2013-543652 A | 12/2013 |
| WO | 2012037235 A1 | 3/2012 |
| WO | 2014167801 A1 | 10/2014 |

OTHER PUBLICATIONS

Zhang et al., (Structure and Superconductivity of Mg(B1-xCx)2 Compounds).*

Sakai et al., (Preparation and Physical Properties of EuC2 and its Solid Solutions, RxEu1-xC2(R=La and Gd).*

Gao et al., (Effect of Sb Doping on the Thermoelectric Properties of Mg2Si0.7Sn0.3 Solid Solutions).*

Tran et al., (Possible non-Fermi liquid behavior in Yb(Cu0.151Si0.849)1.883, Science Direct. (Year: 2006).*

Hashimoto et al., "Thermoelectric Properties of La-Doped BaSi2". Materials Transactions, vol. 49, No. 8, pp. 1737-1740 (2008).

Tani et al., "Fabrication and thermoelectric properties of Mg2Si-based composites using reduction reaction with additives". Intermetallics, vol. 32, pp. 72-80 (2013).

Partial European search report dated Oct. 30, 2018 for European Application No. 18 168 077.8.

Y. Nishino et al.; "Thermal and transport properties of the Heusler-type $Fe_2VAl_{1-x}Ge_x$ (0≤x≤0.20) alloys: Effect of doping on lattice thermal conductivity, electrical resistivity, and Seebeck coefficient", Phys. Rev. B 74, 115115 (2006), p. 115115-1-115115-6.

Yucheng Lan et al.; "Enhancement of Thermoelectric Figure-of-Merit by a Bulk Nanostructuring Approach"; Advanced Functional Materials, 2010, vol. 20, Issue 3, pp. 357-376.

K. Salzgeber et al.; "Skutterudites: Thermoelectric Materials for Automotive Applications?", Journal of Electronic Materials, vol. 39, No. 9, 2010, pp. 2074-2078.

Kanishka Biswas et al.; "High-Performance Bulk Thermoelectrics with All-Scale Hierarchical Architectures"; Nature, vol. 489, Sep. 20, 2012, pp. 414-418.

Office Action dated Oct. 13, 2020 in corresponding Japanese Application No. 2017-096187.

Office Action dated Nov. 16, 2020 in corresponding European Application No. 18168077.8.

Jaccard D et al: "Thermoelectric power of some intermediate valence compounds", Valence Instabilitiesswiss National Science Foundation; European Physical Society; Swiss Federal Institute of Technology, vol. Proc. Int. Cont, No. 1982, Jan. 1982, pp. 409-413.

Iandelli A et al: "Valence fluctuations of ytterbium in silicon-rich compounds", Journal of the Less-Common Metals, vol. 64, No. 2, Apr. 1979 pp. 213-220.

He Dan-Qi et al: "Preparation and Thermoelectric Properties of YbAl3Thermoelectric Materials with Excessive Al", Journal of Electronic Materials, Jan. 2015, pp. 1919-1925, vol. 44, No. 6.

Van Daal H J et al: "Thermoelectric power of ytterbium-aluminum compounds (YbA 12 and YbA 13)", Proceedings of the 11 th Rare Earth Research Conference, Oct. 1974, pp. 733-737, vol. 2.

Examination Report dated Mar. 18, 2020 in corresponding European Application No. 18168077.8.

Office Action dated Jun. 15, 2021 in European Application No. 18168077.8.

Hashimoto et al.., "Thermoelectric properties of BaSi2, SrSi2, and LaSi", Journal of Applied Physics, American Institute of Physics, Sep. 2007, vol. 102, No. 6, p. 63703-63703.

* cited by examiner

THERMOELECTRIC MATERIAL, THERMOELECTRIC MODULE, AND PRODUCING METHOD OF THERMOELECTRIC MATERIAL

CLAIM OF PRIORITY

The present application claims priority from Japanese patent application JP 2017-96187 filed on May 15, 2017, the content of which is hereby incorporated by reference into this application.

BACKGROUND OF THE INVENTION

Field of the Invention

The present invention relates to a thermoelectric material and a producing method thereof.

Background Art

Recently, while interest in an energy issue increases, effective utilization of waste heat which is generated in the process of using primary energy comes into an important object, in addition to a use of renewable energy. The energy quantity of waste heat occupies about 60% of primary energy. Most of the waste heat is generated in extensive places such as a plant, industrial infrastructure, commercial products, and mobility.

A heat pump technology progresses, and thus cases of using waste heat as heat are increased and demands for converting waste heat into electricity and using this electricity as power are increased. As a system of realizing power conversion of heat, a large-scale Rankine cycle (turbine) power generation system which is a steam engine that operates by high-pressure steam of a liquid medium is the mainstream. However, since waste heat is widely dispersed, the waste heat is not suitable for a system in which power conversion is concentrically performed at one place.

As a technology for solving the above-described problem, a thermoelectric system using the Seebeck effect in which a voltage is generated by a temperature difference between materials is known. Since the thermoelectric system does not include a driving unit such as a turbine, the size of the thermoelectric system can be reduced with scalability and the thermoelectric system is suitable for heat recovery at a temperature in a wide range.

Therefore, the thermoelectric system is a technology which can be applied for power generation using a heat source in a limited small space in, for example, an automobile, and can be applied to energy harvesting in which environmental heat is used as a power source. Regarding the former, development of a thermoelectric system for a vehicle, which is performed in order to improve fuel efficiency as measures for the European $CO_2$ emissions regulation (Euro6-7) started in 2017 proceeds fast by vehicle manufacturers. Regarding energy harvesting of the latter, recently, development as a power source of a sensor for IoT progresses.

However, regarding commercialization of the thermoelectric system, improvement of power conversion efficiency and reduction of cost are important problems. In order to improve the power conversion efficiency, it is important to increase a figure of merit ZT of a thermoelectric material which is a component for determining output power of the thermoelectric system and is the most important component in the system. The figure of merit ZT is given as in Expression (1).

$$ZT = \frac{S^2}{(\kappa\rho)}T \quad (1)$$

Here, S indicates a Seebeck coefficient, $\rho$ indicates electric resistivity, $\kappa$ indicates thermal conductivity, and T indicates a temperature. The figure of merit ZT is a dimensionless figure.

For example, in the thermoelectric system applied to an automobile, engine waste heat is utilized as a heat source. Thus, a thermoelectric material which has high figure of merit ZT at the middle to high temperature of 300 degrees to 600 degrees and has low production cost is required. Recently, a waste heat temperature is lowered with an increase of efficiency of an engine and the temperature of a driving unit of an automobile is also lowered with a change of a role of the engine as in, for example, a hybrid electric vehicle and an electric vehicle and discard of the engine. Thus, the thermoelectric material having high thermoelectric properties in the middle temperature range of 150 degrees to 300 degrees. In energy harvesting, application in which electricity is obtained from heat in a temperature range of room temperature to about 100 degrees is the mainstream.

In conclusion, a thermoelectric module having high output in the low to middle temperature range of room temperature to about 300 degrees is required.

The maximum output W of a thermoelectric module which is the core of the thermoelectric technology is determined by a product of heat flux of heat flowing into the module and conversion efficiency $\eta$ of the thermoelectric material. The heat flux depends on a module structure which is suitable for the thermoelectric material.

The conversion efficiency $\eta$ depends on the figure of merit ZT of the thermoelectric material. Thus, the maximum output W of the thermoelectric module is improved by increasing the Seebeck coefficient S, electric resistivity $\rho$, and thermal conductivity $\kappa$ of the thermoelectric material. In particular, it is important to increase a power factor P of the thermoelectric material, which is defined by Expression (2) and indicates power generating capacity of a thermoelectric module, along with improvement of the figure of merit ZT.

$$P = \frac{S^2}{\rho} \quad (2)$$

Figure 12:
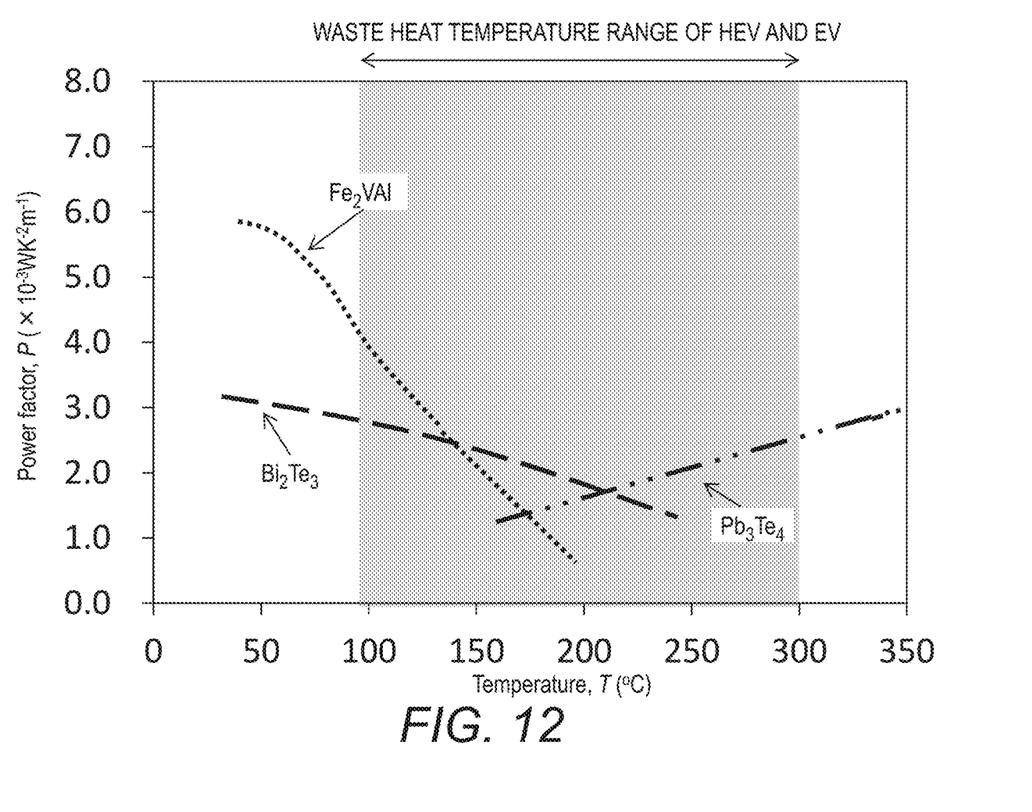
FIG. 12 is a graph illustrating a relationship between the power factor P of the thermoelectric material in the related art and the temperature.

Here, FIG. 12 illustrates a relationship between the power factor P and the temperature of the thermoelectric material in the related art.

As a thermoelectric material having a high power factor P at a low temperature (from room temperature to 150 degrees), Bi—Te-based alloys disclosed in Y. Nishino, S. Deguchi, U. Mizutani, "Thermal and transport properties of the Heusler-type $Fe_2VAl_{1-x}Ge_x$ ($0 \leq x \leq 0.20$) alloys: Effect of doping on lattice thermal conductivity, electrical resistivity, and Seebeck coefficient", Phys. Rev. B 74, 115115 (2006), and Fe-based Heusler alloys disclosed in Yucheng Lan, Austin Jerome Minnich, Gang Chen, Zhifeng Ren, "Enhancement of Thermoelectric Figure-of-Merit by a Bulk Nanostructuring Approach", Advanced Functional Materials, Volume 20, Issue 3, p 357-376 are known. The thermoelectric material having a high power factor P at the middle to high temperature (300 degrees to 600 degrees) can be roughly classified into a metal-based material and a compound (semiconductor) material. Among these types, Co—Sb-based alloys disclosed in K. SALZGEBER, P. PRENNINGER, A. GRYTSIV, P. ROGL, E. BAUER, Journal of ELECTRONIC MATERIALS, "Skutterudites: thermoelectric materials for Automotive Applications?", Vol. 39, No. 9, 2010, pp 2074-2078, and Pb—Te-based compound semiconductors disclosed in Kanishka Biswas, Jiaqing He, Ivan D. Blum, Chun-I Wu, Timothy P. Hogan, David N. Seidman, Vinayak P. Dravid, Mercouri G. Kanatzidis, "High-performance bulk thermoelectrics with all-scale hierarchical architectures", Nature 489, p 414-418 are the representative thermoelectric materials, and a high figure of merit ZT is reported. In addition, silicides of Si, Mn—Si, Mg—Si, and the like having a figure of merit ZT which is lower than those of the above two kinds of materials are reported.

A material having high thermoelectric properties in a temperature range of the middle temperature (150 degrees to 300 degrees) is not reported.

From now on, it is predicted that a thermoelectric material which can be applied to an electric vehicle and a hybrid vehicle is required. However, as described above, a material having high thermoelectric properties such as the power factor P, in a temperature range of the middle temperature is not known.

As described above, regarding the Si silicide material in the related art, the figure of merit ZT or the power factor P is not necessarily high, in comparison to Co—Sb-based alloys and Pb—Te-based compound semiconductors. Thus, an object is to increase the figure of merit ZT or the power factor P of Si or silicide.

SUMMARY OF THE INVENTION

In order to increase the figure of merit ZT, reduction of the thermal conductivity κ or an increase of the power factor P is required. The power factor P can be increased by increasing the Seebeck coefficient S or by decreasing electric resistivity ρ, in a narrow gap semiconductive or metalloid electronic state.

Thus, it is desired to find any condition satisfying the above-described conditions in order to increase the power factor P in Si and silicide.

The representative example of the invention disclosed in this specification is as follows. There is provided a thermoelectric material including a compound which is formed of an element R belonging to alkaline earth metal and lanthanoid, and an element X belonging to any of Group 13 element, Group 14 element, and Group 15 element. The composition ratio of the element R and the element X is selected to obtain the compound having an $AlB_2$ type structure.

According to an aspect of the present invention, it is possible to provide a thermoelectric material having a high power factor P. Problems, components, and advantageous effects other than the above descriptions may be clarified by the descriptions of the following embodiment.

DETAILED DESCRIPTION OF THE INVENTION

Hereinafter, an embodiment of the present invention will be described with reference to the accompanying drawings. The embodiment is just an example for realizing the present invention, and is to be careful not to limit the technical range of the present invention. The common components in the drawings are denoted by the same reference signs.

In the disclosure, an adequate combination and the adequate quantity (adequate composition ratio) of elements, and an adequate producing method and adequate dimensions are provided as means for increasing a power factor P of a thermoelectric material. According to the disclosure, in particular, it is possible to provide a thermoelectric material having a high power factor P even at the middle temperature (150 degrees to 300 degrees).

Figure 1:
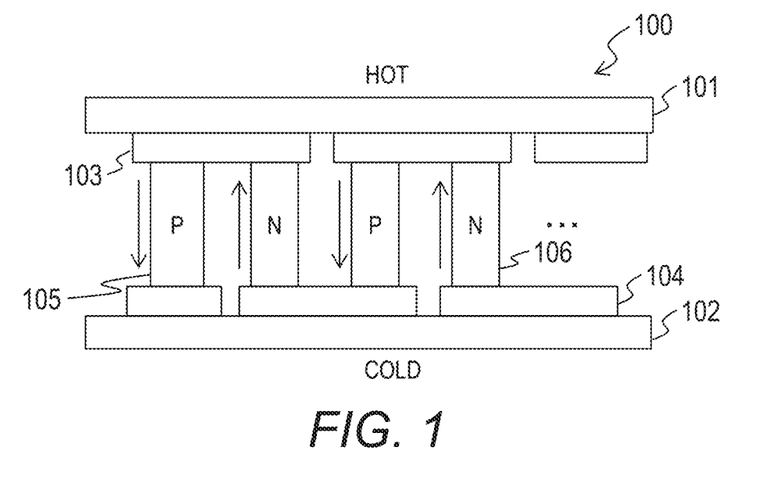
FIG. 1 is a diagram illustrating a configuration example of a thermoelectric module in an example.

The core of the thermoelectric technology is a thermoelectric module. FIG. 1 is a diagram illustrating a configuration example of a thermoelectric module 100 in an example.

The thermoelectric module 100 includes a high-temperature side insulating substrate 101, a low-temperature side insulating substrate 102, a plurality of high-temperature side electrodes 103, a plurality of low-temperature side electrodes 104, a plurality of p-type thermoelectric elements (p-type semiconductor elements) 105, and a plurality of n-type thermoelectric elements (n-type semiconductor elements) 106.

The high-temperature side insulating substrate 101 and the low-temperature side insulating substrate 102 face each other. The plurality of high-temperature side electrodes 103, the plurality of low-temperature side electrodes 104, the plurality of p-type thermoelectric elements 105, and the plurality of n-type thermoelectric elements 106 are disposed on the surfaces of the high-temperature side insulating substrate 101 and the low-temperature side insulating substrate 102, which face each other.

Specifically, the plurality of high-temperature side electrodes 103 which are separated from each other are formed on the surface of the high-temperature side insulating substrate 101, which faces the low-temperature side insulating substrate 102. The plurality of low-temperature side electrodes 104 which are separated from each other are formed on the surface of the low-temperature side insulating substrate 102, which faces the high-temperature side insulating substrate 101.

Each of the p-type thermoelectric elements 105 and each of the n-type thermoelectric elements 106 are connected to the high-temperature side electrode 103 and the low-temperature side electrode 104. The p-type thermoelectric elements 105 are connected in series and the n-type thermoelectric elements 106 are also connected in series. The p-type thermoelectric elements 105 and the n-type thermoelectric elements 106 are alternately arranged.

The thermoelectric module 100 is disposed to be close to a heat source. The high-temperature side insulating substrate 101 is directed toward the heat source. The thermoelectric module 100 generates electricity by a temperature difference which occurs in the thermoelectric module 100. Specifically, the p-type thermoelectric element 105 generates an electromotive force from a low-temperature side to a high-temperature side in a temperature gradient. The n-type thermoelectric element 106 generates an electromotive force from the high-temperature side to the low-temperature side in the temperature gradient.

The p-type thermoelectric elements 105 and the n-type thermoelectric elements 106 are alternately connected in series. Thus, the sum of the electromotive forces generated by the p-type thermoelectric elements 105 and the n-type thermoelectric elements 106 in accordance with the temperature gradient is set as an electromotive force of the thermoelectric module 100.

Next, the principle of increasing the power factor P of a thermoelectric material formed of a silicide compound will be described.

As shown in Expression (1), the figure of merit ZT is increased as a Seebeck coefficient S becomes higher and as electric resistivity ρ and thermal conductivity κ become smaller. The Seebeck coefficient S and the electric resistivity ρ are physical quantities determined in accordance with an electronic state of a substance. The Seebeck coefficient S has a relationship (represented by Expression (3)) with an electronic state.

$$S \propto \left(\frac{1}{N(E_F)}\right) \times \left(\frac{\partial N(E)}{\partial E}\right)_{E=E_f} \tag{3}$$

Here, N indicates state density. E indicates bond energy. $E_F$ indicates a Fermi level.

According to the expression (3), the Seebeck coefficient S is inversely proportional to state density (DOS) N ($E_F$) at the Fermi level and is proportional to an energy gradient (∂N(E)/∂E) of the state density. Thus, it is understood that a substance in which state density of the Fermi level is small and the state density is rapidly increased has a high Seebeck coefficient S. Most of silicides having high state density in the vicinity of the Fermi level have a high Seebeck coefficient S, based on this principle.

The electrical conductivity σ defined by an inverse number of the electric resistivity ρ has a relationship (represented by Expression (4)) with an electronic state.

$$\sigma = \frac{1}{\rho} = \lambda_F v_F N(E_F) \tag{4}$$

Here, $\lambda_F$ indicates a mean free path of electrons at the Fermi level, and $v_F$ indicates a velocity of the electrons at the Fermi level.

According to the expression (4), the electrical conductivity σ is proportional to state density N ($E_F$) at the Fermi level. Thus, when the Fermi level is at an energy position at which the absolute value of the state density N is high, the electrical conductivity σ is high. In a case where a material structure is configured in a scale which is smaller than the mean free path $\lambda_F$ of electrons in Expression (4), electrons at any boundary surface are scattered and the electrical conductivity σ is decreased.

Next, the thermal conductivity κ will be described. The thermal conductivity κ can be considered as the sum of lattice thermal conductivity $\kappa_p$ regarding transfer of heat by lattice vibration and electron thermal conductivity $\kappa_e$ regarding transfer of heat by using electrons as a medium. The electron thermal conductivity $\kappa_e$ is increased by the Wiedeman Franz law as electric resistivity becomes lower, and the electron thermal conductivity $\kappa_e$ depends on the electronic state. The electron thermal conductivity $\kappa_e$ can be reduced by controlling carrier density. Generally, when the carrier density is smaller than $10^{20}/cm^{-3}$, the electron thermal conductivity $\kappa_e$ is the lowest and lattice thermal conductivity $\kappa_p$ is dominant.

However, the decrease of the carrier density causes an increase of the electric resistivity. Thus, it is expected that the figure of merit ZT with respect to the carrier density has the maximum value, in accordance with a trade-off relationship between the increase of the electric resistivity and the decrease of the thermal conductivity, based on the definition of the figure of merit ZT. The lattice thermal conductivity $\kappa_p$ depends on the size of the lattice.

In conclusion, the thermal conductivity κ is qualitatively defined by Expression (5). $k_f$ is represented by Expression (6).

$$\kappa = k_f \times C_p \times \zeta \tag{5}$$

$$k_f = \frac{d^2}{\tau_f} \tag{6}$$

Here, $C_p$ indicates specific heat of a sample at constant pressure. ζ indicates density of a material. d indicates a crystal grain size. $\tau_f$ indicates a time until heat is transferred from the back surface of a grain to the front surface thereof.

As represented by Expressions (5) and (6), the thermal conductivity κ is reduced as the crystal grain size d of a sample becomes smaller. It is considered that suppression of $\kappa_f$ corresponds to suppression of the lattice thermal conductivity $\kappa_p$.

Thus, if the crystal grain size of the sample is reduced while the electronic state of silicide is controlled, it is possible to largely improve the thermoelectric performance.

However, in a case of a silicide-based thermoelectric material which has been examined in the related art, the electric resistivity ρ is increased from the electronic state. As a result, the power factor P in the figure of merit ZT is reduced. Thus, the figure of merit ZT is not increased as much as expected.

Considering the above descriptions, the inventor focused on a compound in which the element R and the element X has a composition ratio for an $AlB_2$ type structure. An element belonging to any of lanthanoid and alkaline earth metal is selected as the element R. An element belonging to any of Group 13 element, Group 14 element, and Group 15 element is selected as the element X. It is desirable that the element X is at least any of Si, Ge, C, B, and Al. In the example, in particular, a compound having a composition ratio of 1:2 attracts attentions.

In the following descriptions, the above-described compound is also described as a compound $RX_2$. It is not necessary that the composition ratio of the compound $RX_2$ is strictly set to 1:2. For example, the composition ratio may be in a range of 1:2.2 to 1:1.8. In the example, various measurements are measured by using YbSi-based silicide as an example of the compound $RX_2$.

Figure 2A:
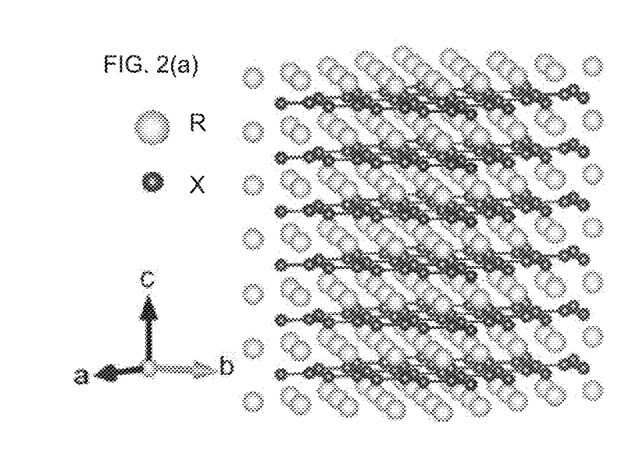
FIGS. 2(a) to 2(c) are diagrams illustrating a crystal structure of a compound $RX_2$ in the example.
Figure 2B:
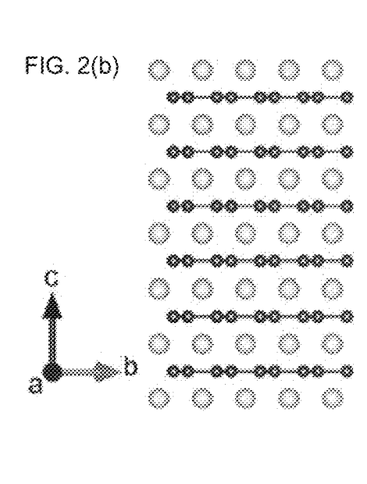
Figure 2C:
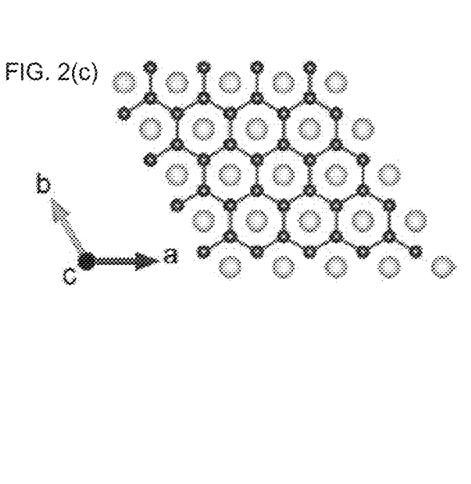
Figure 3A:
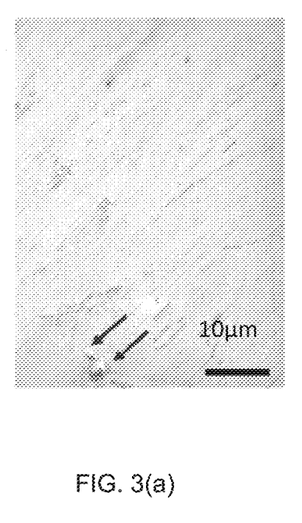
FIGS. 3(a) to 3(d) are diagrams illustrating results of XRD analysis of the thermoelectric material in the example.
Figure 3B:
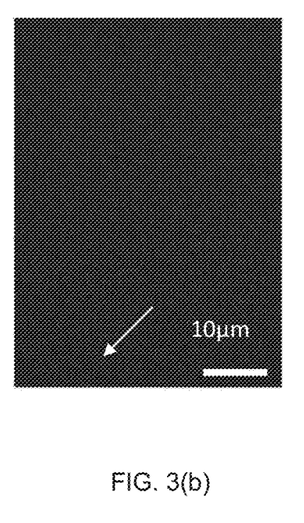
Figure 3C:
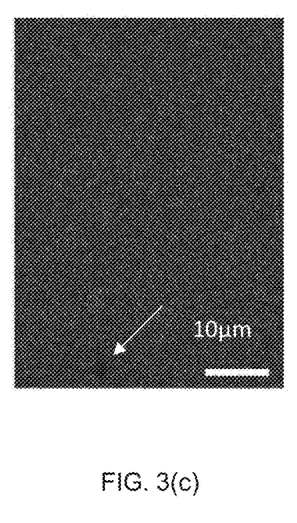
Figure 3D:
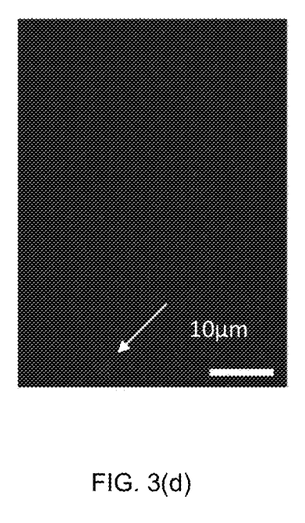

FIGS. 2(a) to 2(c) are diagrams illustrating a crystal structure of the compound $RX_2$ in the example.

The compound $RX_2$ has an $AlB_2$ type crystal structure. Specifically, the element R and the element X form a layer and the element X has a honeycomb structure. Regarding silicide represented by the compound $RX_2$, the electric resistivity from the metallic electronic state can be reduced up to about 1/100 of that of silicide in the related art, but the Seebeck coefficient S can maintain tens µV/K.

The inventors focused on YbSi-based silicide among many kinds of silicide. The YbSi-based silicide is a semiconductor or metal which has electric resistivity which is significantly low and has features of a d electron system and an f electron system in comparison to other metal silicides, because the valence number thereof is between two and three by valence fluctuation of Yb which occurs by the crystal structure illustrated in FIGS. 2(a) to 2(c). Accordingly, the state density in the vicinity of the Fermi level is high and the state density at the Fermi level is low. Thus, a relatively high Seebeck coefficient S is shown.

Regarding the features, the similar effect is obtained even though Si is changed to Al or Ge, or Al and Ge are added in addition to Si from a viewpoint of valence electron adjustment. The similar effect is obtained even though B and C are added in addition to Si.

The similar effect is obtained even though a lanthanoid element which performs valence fluctuation similarly to Yb is used as the element R. The similar effect is obtained even though alkaline earth metal such as Ca is used as the element R.

In the sample used in the experiment, the composition ratio (atomic percent) of Yb and Si is selected in the vicinity of 33.3:66.7 (at %).

In the following descriptions, an element combination, an element composition ratio, a combination of crystal phases, dimensions, a producing method, and the like which are suitable for increasing the power factor P of the silicide will be more specifically described. The thermoelectric material in the disclosure can be produced in a form of a thin film or a bulk.

Example 1

In the following descriptions, production of a sample and measurement results of the sample will be described.

The inventors produced a bulk of a thermoelectric material containing $YbSi_2$ as an example. Further, the inventors evaluated the crystal structure, the organizational structure, and thermoelectric properties of each of the plural kinds of produced thermoelectric materials.

In the production of a thermoelectric material, firstly, a raw material having a composition ratio adjusted to be a desired composition ratio was dissolved by an arc melting method, so as to obtain a base alloy. Then, powder obtained by grinding the base alloy was sintered by an SPS method. Thereby, the thermoelectric material was produced. The thermoelectric material used in the example was produced by a producing method as follows.

Firstly, Si and Yb as raw materials are weighed to have a desired composition ratio. The raw materials are put into a chamber for arc melting, and then are dissolved in an atmosphere of an inert gas a plurality of times. Thereby, a base alloy is obtained. The obtained base alloy is ground by a grinder, and thus fine powder is obtained. The fine powder is sintered in low vacuum in which an inert gas is provided as the main component, by an SPS method with a carbon tool. Thereby, a desired thermoelectric material is obtained. Specifically, sintering is performed under pressure of 40 MPa to 5 GPa as pressurizing conditions, while a pulse current is applied. The pressurizing direction is a uniaxial direction. Plastic deformation is caused, and thus the thermoelectric material is densified. Regarding a sintering temperature condition, the highest temperature of 700 degrees to 1200 degrees is held for 3 minutes to 180 minutes. Then, an aimed thermoelectric material is obtained by performing cooling up to room temperature.

The producing method can be also applied to a raw material configured with Yb and one or a plurality of metal elements selected from the group consisting of Si and Ge.

Figure 4:
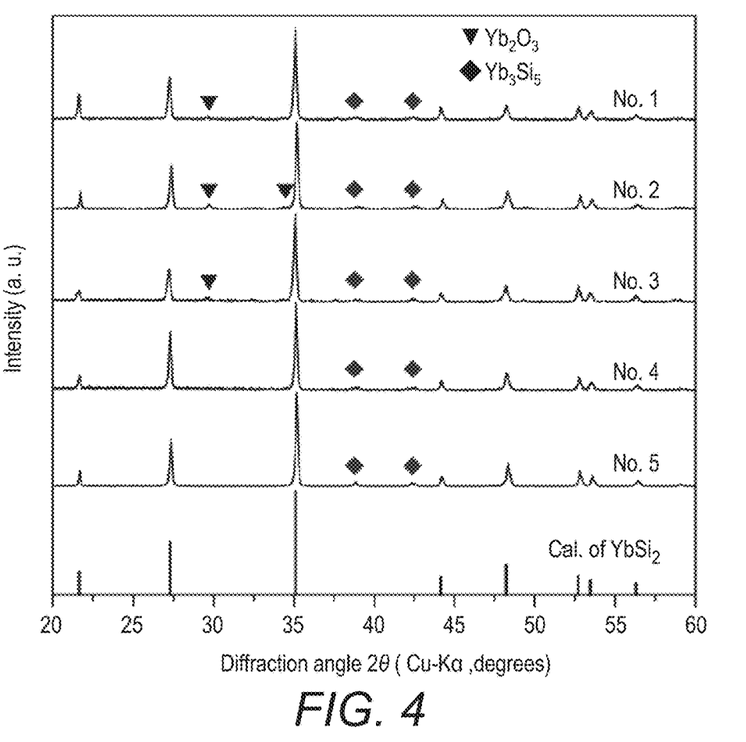
FIG. 4 illustrates a SEM image of the thermoelectric material in the example.

FIGS. 3(a) to 3(d) and FIG. 4 illustrate the structure of the polycrystalline thermoelectric material and evaluation results of the crystal structure. FIGS. 3(a) to 3(d) are diagrams illustrating results of XRD analysis of the thermoelectric material in the example. FIG. 4 illustrates a SEM image of the thermoelectric material in the example.

A region indicated by an arrow in FIGS. 3(a) to 3(d) represents an oxide of Yb. As illustrated in FIGS. 3(a) to 3(d), a region other than the region indicated by the arrow is uniform. Thus, it is roughly understood that $YbSi_2$ is formed. As illustrated in FIG. 4, it is understood that the thermoelectric material includes $YbSi_2$ having a desired crystal structure, as the main component, and includes $Yb_2O_2$ and $Yb_3Si_5$.

Measurement results of the Seebeck coefficient S, the electrical conductivity σ, the power factor P, the thermal conductivity κ, the lattice thermal conductivity $κ_p$, and the figure of merit ZT are shown in FIGS. 5 to 10. The inventors measured the Seebeck coefficient S and the electrical conductivity σ by using a thermoelectric property evaluation device. The inventors obtained the thermal conductivity κ by measuring thermal diffusivity by using a laser flash method, and by measuring specific heat by using a DSC method.

Figure 5:
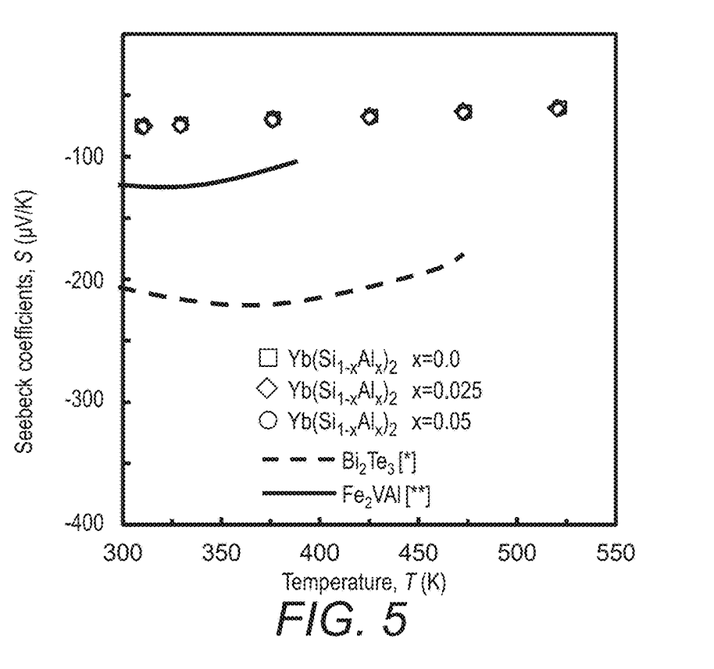
FIG. 5 is a graph illustrating measurement results of a Seebeck coefficient S of the thermoelectric material in the example.
Figure 6:
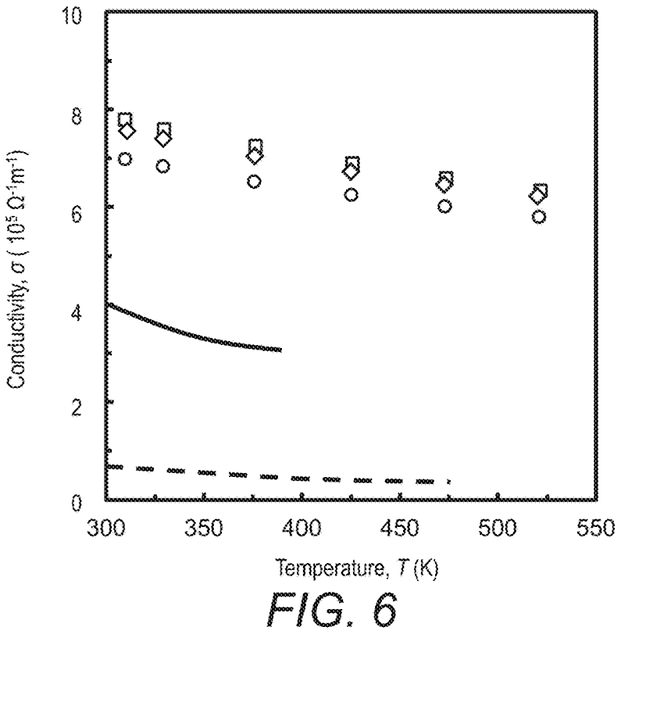
FIG. 6 is a graph illustrating measurement results of electrical conductivity σ of the thermoelectric material in the example.
Figure 7:
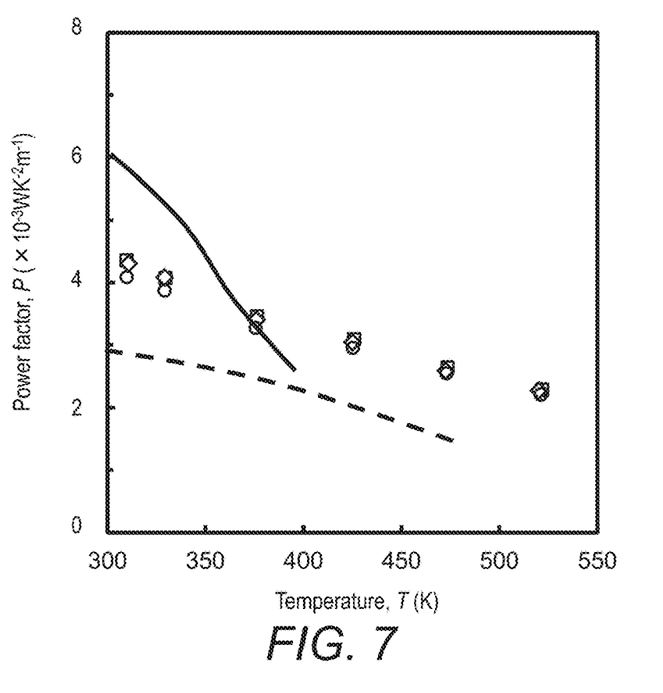
FIG. 7 is a graph illustrating measurement results of a power factor P of the thermoelectric material in the example.
Figure 8:
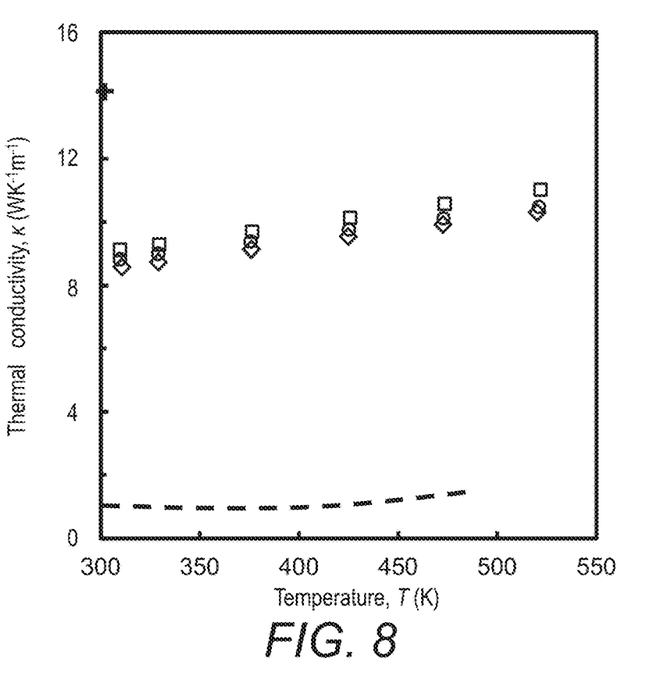
FIG. 8 is a graph illustrating measurement results of thermal conductivity κ of the thermoelectric material in the example.
Figure 9:
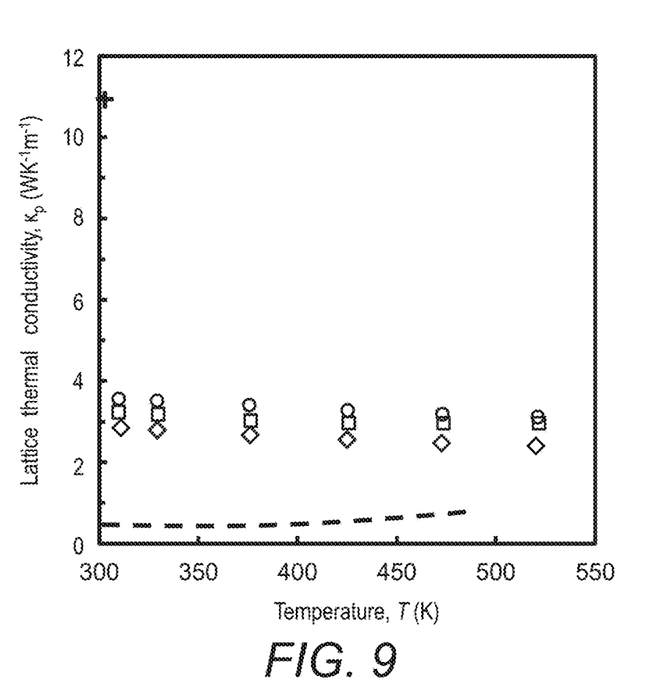
FIG. 9 is a graph illustrating measurement results of lattice thermal conductivity $κ_p$ of the thermoelectric material in the example.
Figure 10:
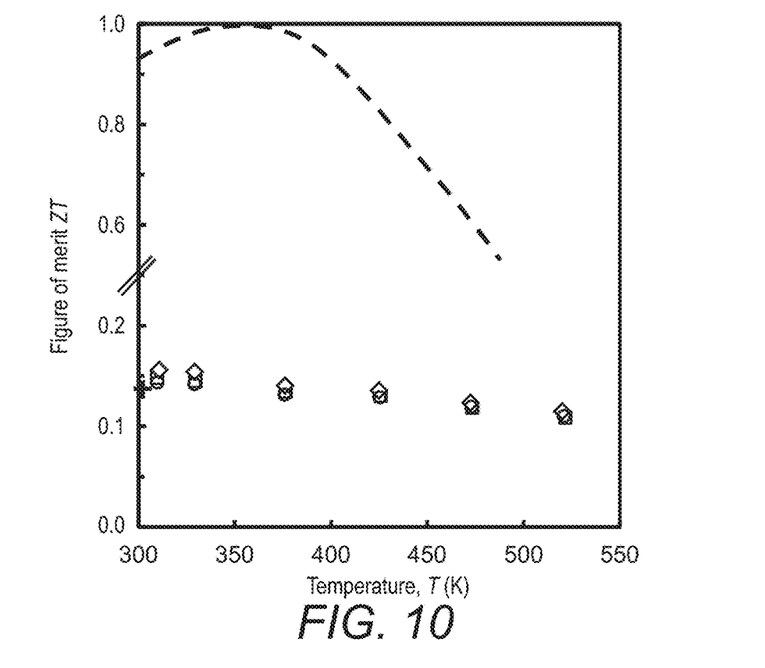
FIG. 10 is a graph illustrating measurement results of a figure of merit ZT of the thermoelectric material in the example.

FIG. 5 is a graph illustrating measurement results of the Seebeck coefficient S of the thermoelectric material in the example. FIG. 6 is a graph illustrating measurement results of the electrical conductivity σ of the thermoelectric material in the example. FIG. 7 is a graph illustrating measurement results of the power factor P of the thermoelectric material in the example. FIG. 8 is a graph illustrating measurement results of the thermal conductivity κ of the thermoelectric material in the example. FIG. 9 is a graph illustrating measurement results of the lattice thermal conductivity $κ_p$ of the thermoelectric material in the example. FIG. 10 is a graph illustrating measurement results of the figure of merit ZT of the thermoelectric material in the example.

As illustrated in FIG. 5, the Seebeck coefficient S of the thermoelectric material in the example is increased with an increase of the temperature, but is substantially constant. As illustrated in FIG. 6, the electrical conductivity σ of the thermoelectric material in the example is monotonically decreased with the increase of the temperature. As illustrated in FIG. 7, the power factor P of the thermoelectric material in the example is very high and is monotonically decreased with the increase of the temperature. As illustrated in FIG. 8, the thermal conductivity κ of the thermoelectric material in the example is monotonically increased with the increase of the temperature. As illustrated in FIG. 9, the lattice thermal conductivity $κ_p$ of the thermoelectric material in the example is reduced with the increase of the temperature, but is substantially constant. As illustrated in FIG. 10, the figure of merit ZT of the thermoelectric material in the example is reduced with the increase of the temperature, but is substantially constant.

Figure 11:
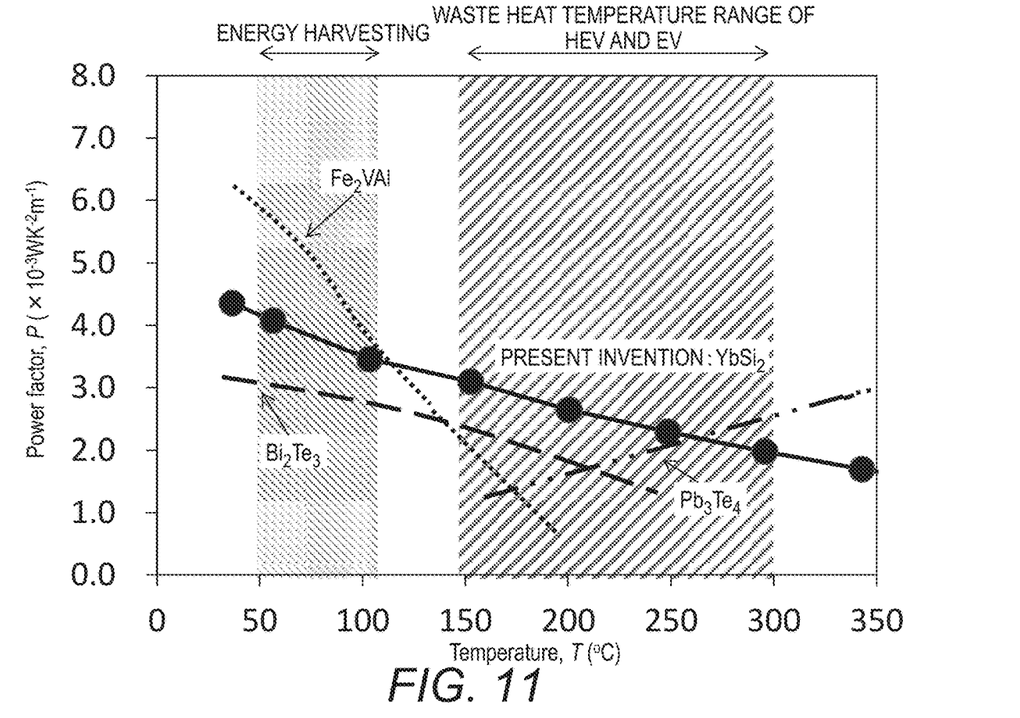
FIG. 11 is a graph illustrating comparison results of the power factor P between the thermoelectric material in the example and a thermoelectric material in the related art.

FIG. 11 is a graph illustrating comparison results of the power factor P between the thermoelectric material in the example and the thermoelectric material in the related art.

As illustrated in FIG. 11, it is understood that, in the thermoelectric material in the example, the high power factor P is obtained in both temperature ranges of a low temperature (from room temperature to 150 degrees) and the middle temperature (from 150 degrees to 300 degrees), in particular, in a temperature range of 100 degrees to 250 degrees.

Here, the example for $YbSi_2$ is described as an example. However, the similar effect is obtained even in a case where a portion or the entirety of Si is substituted with Ge or Sn which is the same Group 14 element on the periodic table and has a valence electron number which is equal to that of Si. The similar effect is obtained even in a case where elements which respectively belong to Group 13 element and Group 15 element are combined so as not to change the valence electron number, in order to obtain properties which are equivalent to those of Si in Group 14 similarly to other compounds, and a portion or the entirety of Si is substituted with the combination. This is similarly applied even in a case where another element belonging to Group 14 element is used instead of Si. That is, if the element X of an appropriate amount is selected from Si, Ge, Sn, Al, Ga, In, Pb, P, As, Sb, Bi, N, B, and C, from a viewpoint of the above-described valence electron adjustment, and then synthesis is performed, an effect similar to that of $YbSi_2$ is obtained.

The thermoelectric material in the example, in particular, $YbSi_2$ has features as follows, in addition to the feature of high thermoelectric properties. Firstly, since $YbSi_2$ has Si as the main raw material, the production cost is low, and the Clarke number is large. Secondly, since $YbSi_2$ has Si as the main raw material, toxicity is little. Thirdly, the silicide-based thermoelectric material generally has high strength and high toughness.

Therefore, it is possible to produce a thermoelectric material which can be applied to various applications, with low cost and a large amount.

The present invention is not limited to the above examples and includes various modification examples. For example, the above-described examples are described in detail in order to intelligibly describe the present invention, and the present invention is not necessarily limited to a case where all of the described components are provided. Some of the components in one example can be substituted with components in another example, and components in another example can be added to components in one example. Regarding some of the components in each of the examples, addition of another component, removal, and substitution can be made.

What is claimed is:

1. A thermoelectric material, comprising:
   a compound formed of an element R and an element X, the compound being a main component of the thermoelectric material,
   wherein the element R is Yb, and the element X is Si or Ge, wherein a composition ratio of the element R to the element X is 1:2.2, and
   wherein, due to the composition ratio of the element R to the element X, the compound has an aluminum diboride ($AlB_2$) type crystal structure.

2. A thermoelectric module comprising:
   a plurality of the thermoelectric material according to claim 1; and a plurality of electrodes.

3. A producing method of a thermoelectric material, the method comprising:
   a first step of weighing an element R and an element X so as to obtain a compound where, due to a composition ratio of the element R to the element X, the compound has an aluminum diboride ($AlB_2$) type crystal structure, wherein the element R is Yb,
   wherein the element X is Si or Ge, wherein the composition ratio of the element R to the element X is 1:2.2, and
   wherein the compound is a main component of the thermoelectric material;
   a second step of dissolving the element R and the element X by using an arc melting method, so as to obtain a base alloy;
   a third step of grinding the base alloy in order to obtain a powder base alloy; and
   a fourth step of sintering the powder base ally by using an SPS method to obtain the thermoelectric material include the compound.

4. The producing method of a thermoelectric material according to claim 3, wherein, in the fourth step, the powdery base alloy is sintered under pressure of 40 MPA to 5 GPA while a pulse current is applied.

* * * * *

UNITED STATES PATENT AND TRADEMARK OFFICE
CERTIFICATE OF CORRECTION

PATENT NO. : 11,251,353 B2
APPLICATION NO. : 15/957952
DATED : February 15, 2022
INVENTOR(S) : Akinori Nishide et al.

It is certified that error appears in the above-identified patent and that said Letters Patent is hereby corrected as shown below:

In the Claims

Claim 4, at Column 10, Line 53:
Please change "powdery" to --powder--.

Signed and Sealed this
Fifth Day of July, 2022

Katherine Kelly Vidal
*Director of the United States Patent and Trademark Office*